(12) United States Patent
Kobayashi et al.

(10) Patent No.: US 7,776,736 B2
(45) Date of Patent: Aug. 17, 2010

(54) SUBSTRATE FOR ELECTRONIC DEVICE CAPABLE OF SUPPRESSING FLUORINE ATOMS EXPOSED AT THE SURFACE OF INSULATING FILM FROM REACTING WITH WATER AND METHOD FOR PROCESSING SAME

(75) Inventors: Yasuo Kobayashi, Nirasaki (JP); Kohei Kawamura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 712 days.

(21) Appl. No.: 11/596,186

(22) PCT Filed: May 10, 2005

(86) PCT No.: PCT/JP2005/008506

§ 371 (c)(1),
(2), (4) Date: Nov. 13, 2006

(87) PCT Pub. No.: WO2005/109483

PCT Pub. Date: Nov. 17, 2005

(65) Prior Publication Data

US 2007/0228527 A1    Oct. 4, 2007

(30) Foreign Application Priority Data

May 11, 2004  (JP)  ............................ 2004-141022

(51) Int. Cl.
*H01L 29/40* (2006.01)
*H01L 21/4763* (2006.01)
(52) U.S. Cl. ..................... 438/622; 438/623; 438/624
(58) Field of Classification Search ............. 438/622, 438/623, 624
See application file for complete search history.

(56) References Cited

U.S. PATENT DOCUMENTS

| | | | | |
|---|---|---|---|---|
| 6,001,728 A | * | 12/1999 | Bhan et al. | 438/624 |
| 6,383,346 B2 | * | 5/2002 | Ando et al. | 204/192.26 |
| 6,479,897 B2 | * | 11/2002 | Akahori et al. | 257/750 |
| 6,611,378 B1 | * | 8/2003 | Wang et al. | 359/588 |
| 6,730,591 B2 | * | 5/2004 | Han et al. | 438/618 |
| 6,787,445 B1 | * | 9/2004 | Jiwari et al. | 438/623 |
| 6,958,525 B2 | * | 10/2005 | Nakata et al. | 257/642 |
| 2001/0052650 A1 | * | 12/2001 | Takata et al. | 257/758 |

(Continued)

FOREIGN PATENT DOCUMENTS

JP    06298971    * 10/1994

(Continued)

*Primary Examiner*—Matthew C Landau
*Assistant Examiner*—James M Mitchell
(74) *Attorney, Agent, or Firm*—Oblon, Spivak, McClelland, Maier & Neustadt, L.L.P.

(57) ABSTRACT

Disclosed are a substrate for electronic devices such as semiconductor devices and a method for processing the same, In the processing method, firstly a substrate for electronic devices is prepared and an insulating film (I) composed of a fluorocarbon (CF) is formed on the surface of the substrate. Then, fluorine (F) atoms exposed in the surface of the insulating film (I) are removed therefrom by bombarding the surface of the insulating film (I) with, for example, active species ($KR^+$) produced in a krypton (Kr) gas plasma. In this connection, the substrate is kept out of contact with moisture at least from immediately after the insulating film forming step until completion of the fluorine removing step.

22 Claims, 9 Drawing Sheets

U.S. PATENT DOCUMENTS

2002/0047203 A1 * 4/2002 Akahori et al. ............. 257/753
2003/0040172 A1 * 2/2003 Brennan ..................... 438/622

FOREIGN PATENT DOCUMENTS

| JP | 10 144677 | 5/1998 |
| JP | 10-144677 | 5/1998 |
| JP | 11 135494 | 5/1999 |
| JP | 11 154672 | 6/1999 |
| JP | 11-330075 | 11/1999 |
| JP | 2001-284289 | 10/2001 |
| JP | 2005-302811 | 10/2005 |

* cited by examiner

SUBSTRATE FOR ELECTRONIC DEVICE CAPABLE OF SUPPRESSING FLUORINE ATOMS EXPOSED AT THE SURFACE OF INSULATING FILM FROM REACTING WITH WATER AND METHOD FOR PROCESSING SAME

FIELD OF THE INVENTION

The present invention relates to a substrate for use in electronic devices such as a semiconductor device, a liquid crystal display, an organic EL device and the like, and a method for processing the substrate.

BACKGROUND OF THE INVENTION

There has been proposed a multi-layered wiring structure as an approach for achieving a high integration of a semiconductor device. In order to obtain the multi-layered wiring structure, an $n^{th}$ layer and an $(n+1)^{th}$ layer are connected to each other through a conductive layer while thin films called interlayer insulating films are formed in areas other than the conductive layer. Although a $SiO_2$ oxide film has been widely used as a typical interlayer insulating film, there has been a demand to lower a relative dielectric constant of the interlayer insulating film to further accelerate the operation speed of the semiconductor device.

In this regard, an insulating film (referred to as "CF insulating film," hereinafter) made up of fluorine and carbon (fluorocarbon) has been gaining attention. By using this CF insulating film, the relative dielectric constant can be significantly reduced compared with a silicon oxide film.

Forming of the CF insulating film is carried out, for example, in a plasma processing apparatus, by exciting, e.g., $C_5F_8$ which is a source gas of fluorine and carbon and by depositing radicals generated thereby onto a substrate. At this time, a plasma gas used in generating plasma such as argon gas is converted into plasma by, e.g., microwave, and the source gas is excited by this plasma. (e.g., see Japanese Patent Laid-open Application No. H11-162960)

Figure 10:
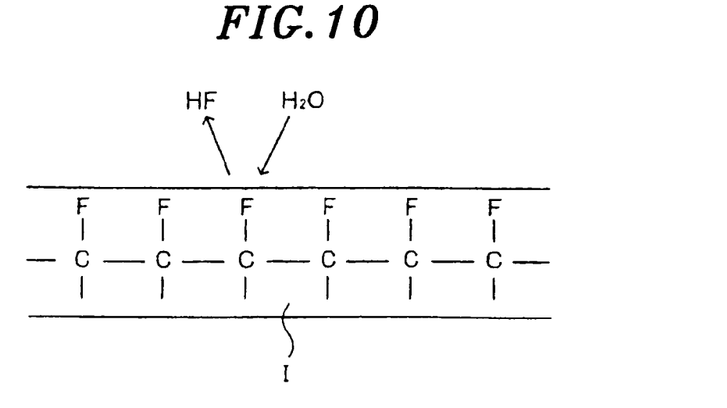
FIG. 10 is an exemplary diagram showing a state where fluorine atoms are exposed at the surface of the CF insulating film.

However, as shown in FIG. 10, when forming the CF insulating film, fluorine atoms in the CF insulating film I are arranged at the surface side of the film and exposed at the surface of the film. The fluorine atoms have a high electronegativity and a characteristic of easily adsorbing water molecules. Consequently, if the fluorine atoms are left and exposed at the surface of the film, water molecules will be adsorbed to the fluorine atoms while the substrate is transferred, for example.

Further, when the substrate is heated after the film is formed thereof, for example, the adsorbed water molecules are initiated to react with the fluorine atoms. The fluorine atoms that have been reacted with the water molecules gets released as a hydrogen fluoride gas from the CF insulating film I. Such hydrogen fluoride gas has a property of corroding and destroying the film. For example, the hydrogen fluoride gas may react with a barrier metal film formed between a conductive layer within a semiconductor device and the interlayer insulating film, to destroy and peel off the barrier metal film. This results in an improper multi-layered wiring structure of the semiconductor device, thereby significantly reducing the efficiency of manufacturing the semiconductor device.

Further, the surface of the CF insulating film I may be degenerated by reacting with the water molecules, thereby deteriorating the leak characteristic of the CF insulating film. As a result, the insulating performance of the interlayer insulating film formed by the CF insulating film I decreases, thereby diminishing the performance of the semiconductor device.

SUMMARY OF THE INVENTION

It is, therefore, an object of the present invention to provide a substrate for electronic device capable of suppressing fluorine atoms exposed at the surface of a CF insulating film from reacting with water molecules, and a method for processing the same.

In order to achieve the above objects, a method of processing a substrate for electronic device in accordance with the present invention includes the steps of preparing a substrate for electronic device; forming an insulating film made up of fluorine and carbon onto a surface of the substrate; and releasing fluorine atoms exposed at the surface of the insulating film therefrom; wherein the substrate is kept out of contact with water molecules, at least, from immediately after the insulating film forming step until completion of the fluorine atom releasing step.

With such a method, by releasing the fluorine atoms exposed at the surface of the insulating film from the insulating film before it could come in contact with water molecules, the reaction of the fluorine atoms with water molecules can be suppressed. Accordingly, since the hydrogen fluoride gas is not generated from the surface of the insulating film, other films are prevented from being damaged and peeled off by the hydrogen fluoride gas. Further, the surface of the insulating film is prevented from degeneration; thereby increasing a relative dielectric constant thereof is prevented as well.

The releasing step of the fluorine atoms can be performed by making active species, generated in plasma of a rare gas or nitrogen gas, collide against the surface of the insulating film. In this way, the fluorine atoms at the surface of the insulating film are sputtered and released from the insulating film by the physical collisions of the active species.

The fluorine atom releasing step may also be performed by exposing the substrate to plasma generated from a rare gas or nitrogen gas. In this way, with energy of the plasma itself, which is generated from a non-reactive gas such as a rare gas or nitrogen gas, and/or a photon energy getting released when the plasma is converted back to gas, the fluorine atoms at the surface of the insulating film can be released. The rare gas is selected from a group consisting of, for example, argon gas, xenon gas and krypton gas.

It is preferred that the fluorine atom releasing step is performed within a plasma space having an electron temperature of less than 2 eV and an electron density of higher than $1 \times 10^{11}$ electrons/$cm^3$. By exposing the substrate to such high density plasma space, the fluorine atoms can be efficiently released in a short period of time.

The fluorine atom releasing step may be performed by irradiating electron beams or ultraviolet rays to the surface of the insulating film. In this way, the fluorine atoms at the surface of the insulating film can be released by the electron beams or the ultraviolet rays. Further, since the electron beams and the ultraviolet rays are penetrated even into the insulating film, fluorine atoms existing in an unstable state, due to an incomplete bonding with the insulating film, can also be released. As a result, the quality of the insulating film itself can also be improved.

The substrate processing method may further include the step of forming a protective film on the insulating film to prevent water molecules from contacting with the surface of the insulating film. In this case, since water molecules are prevented from contacting with the insulating film because of the protective film, the reaction of the fluorine atoms with water molecules are more securely prevented.

Another method of processing a substrate for electronic device in accordance with the present invention includes the steps of preparing a substrate for electronic device; forming an insulating film, made up of fluorine and carbon, onto a surface of the substrate; and forming a protective film on the insulating film for preventing water molecules from contacting with the surface of the insulating film.

With such a method, water molecules are prevented from contacting with the surface of the insulating film because of the protective film, and it is prevented that the fluorine atoms exposed at the surface of the insulating film is reacted with water molecules. Consequently, other films are prevented from being damaged and peeled off which could result from generation of hydrogen fluoride gas. Further, it is also prevented that the surface of the insulating film is changed in quality to increase a relative dielectric constant of the insulating film.

In this case, it is preferable that the substrate is kept out of contact with water molecules from immediately after the insulating film forming step until completion of the protective film forming step.

Further, in order to achieve the above objects, a substrate for electronic device in accordance with the present invention is characterized in that an insulating film made up of fluorine and carbon is formed on the substrate and a protective film is formed on the insulating film to prevent water molecules from contacting with a surface of the insulating film.

In accordance with the substrate for electronic device, the fluorine atoms at the surface of the insulating film are prevented from contacting water molecules and reacting therewith by the protective film. Consequently, no hydrogen fluorine gas is generated from the surface of the insulating film, so that the electronic device can be prevented from being damaged by the hydrogen fluoride gas. Further, it is prevented that the insulating film is degenerated to increase the relative dielectric constant thereof.

The material for the protective film is selected from a group consisting of amorphous carbon, SiN, SiCN, SiC, SiCO and CN. By forming protective films with the material having a low relative dielectric constant, the relative dielectric constant of the whole films including the insulating film and the protective film can be maintained at low.

It is preferred that the protective film has a thickness of less than 200 Å. In this way, the relative dielectric constant of the whole films including the protective film and the insulating film can be prevented from increasing.

DETAILED DESCRIPTION OF THE PREFERRED EMBODIMENTS

Hereinafter, preferred embodiments of the present invention will be described with reference to the accompanying drawings.

First, there will be described a substrate processing system used in a processing method of a substrate for electronic device in accordance with the present invention.

Figure 1:
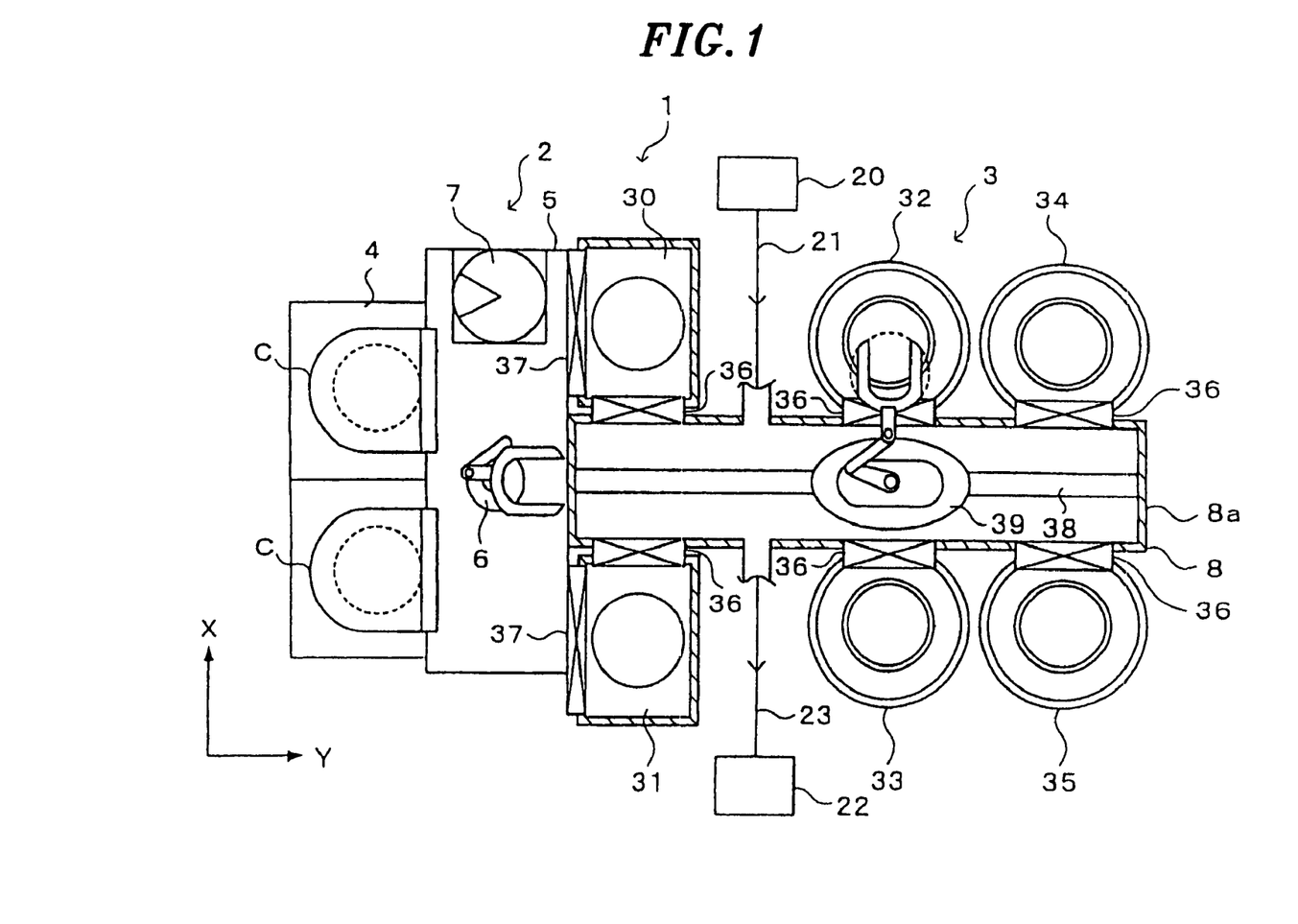
FIG. 1 is a schematic view of a substrate processing system used in a processing method of a substrate for electronic device in accordance with the present invention.

As shown in FIG. 1, a substrate processing system 1 includes a cassette station 2 and a processing station 3 having a plurality of processing apparatuses 32 to 35, the cassette station 2 and the processing station 3 being connected as a whole in the Y-direction (a horizontal direction in FIG. 1). The cassette station 2 serves to transfer a plurality of substrates W (for example, in a state where they are accommodated in cassettes C) between the substrate processing system 1 and the outside thereof, and load and unload the substrates W to and from the respective cassettes C. Further, the processing station 3 is configured to process the substrates W one by one by using each of the processing apparatuses 32 to 35.

The cassette station 2 includes a cassette table 4 and a transfer chamber 5. The cassette table 4 is configured to mount thereon two cassettes C arranged in the X-direction (a vertical direction in FIG. 1). Provided within the transfer chamber 5 are a substrate transfer unit 6 constructed by a multi-joint robot and a pre-alignment stage 7. The substrate transfer unit 6 is configured to transfer the substrates W between the cassettes C on the cassette table 4, the pre-alignment stage 7, and load-lock chambers 30, 31 of the processing station 3, which will be described later.

The processing station 3 includes a transfer path 8 formed at its middle portion and extending linearly in the Y-direction from the cassette station 2. The transfer path 8 is covered with a casing 8a which is capable of enclosing the transfer path 8. Since a gas supply line 21 communicating with a gas supply source 20 of a dry gas is connected with the casing 8a, the dry gas can be supplied into the casing 8a from the gas supply source 20 through the gas supply line 21. Further, a non-reactive gas such as a rare gas or nitrogen gas is employed as the dry gas. Connected with the casing 8a is a gas exhaust line 23 communicating with a negative pressure generator 22, and the inside of the casing 8a can be depressurized by a gas exhaust through the gas exhaust line 23. Accordingly, after replacing the atmosphere within the transfer path 8 with a specific dry air, the inner space of the transfer path 8 can be depressurized to a predetermined pressure. In other words, it is possible to maintain the inside of the transfer path 8 in an atmosphere free of moisture after eliminating moisture therefrom.

Disposed at both sides of the transfer path 8 are the load-lock chambers 30, 31, insulating film forming apparatuses 32, 33 and insulating film processing apparatuses 34, 35. The load-lock chambers 30, 31 and the apparatuses 32 to 35 are connected to the transfer path 8 through respective gate valves 36. The load-lock chambers 30, 31 are located adjacent to the transfer chamber 5 of the cassette station 2, and the load-lock chambers 30, 31 are connected to the transfer chamber 5 through respective gate valves 37. Accordingly, the substrates W within the transfer chamber 5 are transferred to the transfer path 8 via the load-lock chambers 30, 31.

Provided within the transfer path 8 are a transfer rail 38 and a substrate transfer device 39, the transfer rail 38 extending in the Y-direction and the substrate transfer device 39 being capable of freely moving on the transfer rail 38. The substrate transfer device 39 is constructed by a multi-joint robot and serves to transfer the substrates W between the load-lock chambers 30, 31, the insulating film forming apparatuses 32, 33, the insulating film processing apparatuses 34, 35 and the transfer path 8 through the corresponding gate valves 36. With such constructions, the substrates W loaded into the transfer path 8 from the load-lock chambers 30, 31 can be selectively transferred to each of the apparatuses 32 to 35, while maintaining the inside of the transfer path 8 in a dry atmosphere. In this way, a specific processing can be performed on the substrates W in each of the apparatuses 32 to 35.

Next, there will be described the configurations of the aforementioned insulating film forming apparatuses 32, 33 by taking the insulating film forming apparatus 32 as an example.

Figure 2:
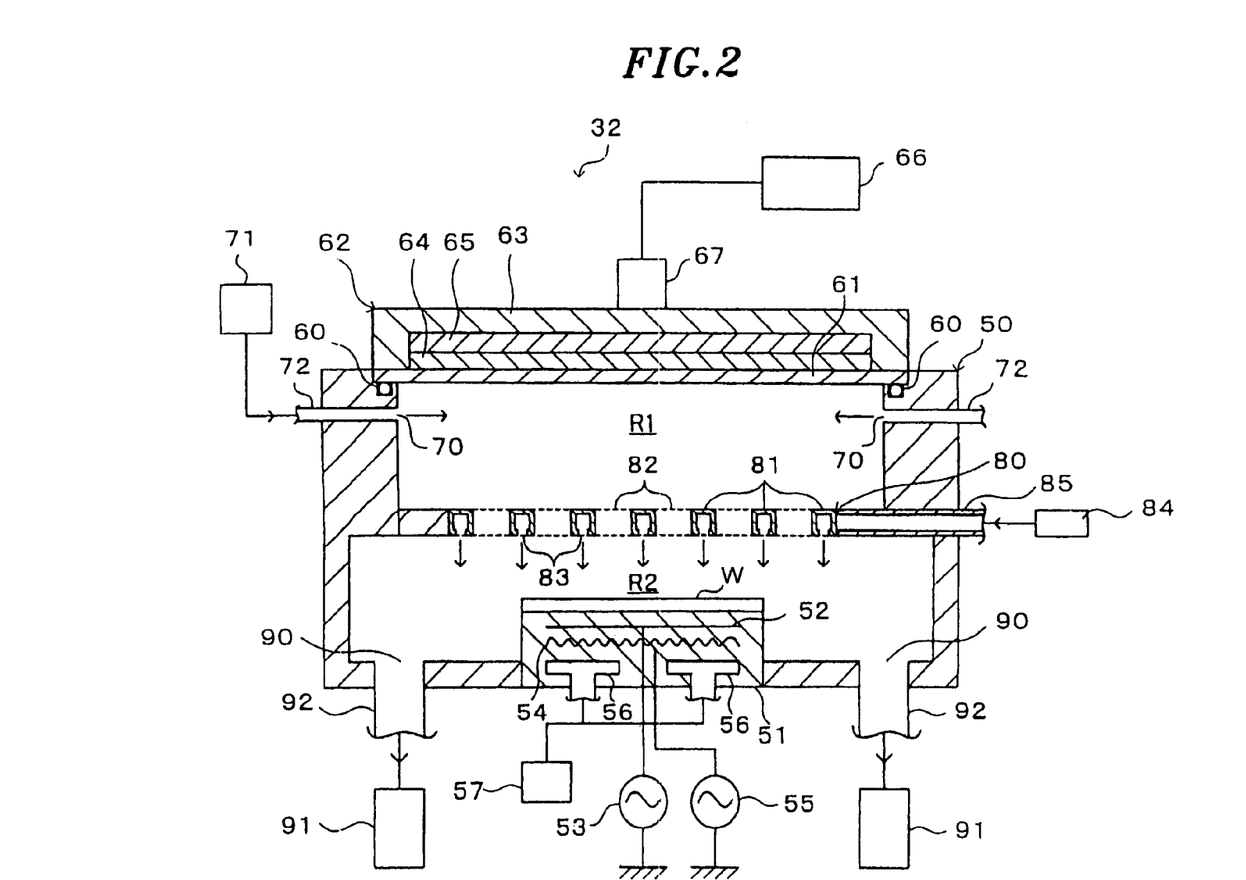
FIG. 2 is a cross sectional view of an insulating film forming apparatus in the system shown in FIG. 1.

FIG. 2 shows schematically a cross sectional view of the insulating film forming apparatus 32. This insulating film forming apparatus 32 is a plasma CVD (chemical vapor deposition) apparatus for forming a CF insulating film made up of fluorine and carbon on the substrate W.

As shown in FIG. 2, the insulating film forming apparatus 32 includes, for example, a processing chamber 50 of a cylindrical shape having a bottom wall with its top opened. The processing chamber 50 is formed of, e.g., aluminum alloy and grounded. A mounting table 51 for mounting the substrate W thereon is provided approximately at the middle portion of the bottom wall of the processing chamber 50.

An electrode plate 52 is embedded in the mounting table 51 and is connected to a bias high frequency power supply 53 of, e.g., 13.56 MHz which is provided at an outside of the processing chamber 50. By applying a negative high voltage to the surface of the mounting table 51 from the high frequency power supply 53, charged particles in plasma can be attracted thereto. Further, the electrode plate 52 is also connected to a DC power supply (not shown), which generates an electrostatic force on the surface of the mounting table 51 so that the substrate W can be electrostatically chucked onto the mounting table 51.

A heater 54 is provided within the mounting table 51. The heater 54 is connected to a power supply 55 provided at an outside of the processing chamber 50 and generates heat with a power applied thereto from the power supply 55 to heat the mounting table 51 to a predetermined temperature. Provided within the mounting table 51 is, for example, a cooling jacket 56 through which a cooling medium flows. The cooling jacket 56 is in communication with a coolant supply unit 57 installed at an outside of the processing chamber 50. The mounting table 51 can be cooled to a predetermined temperature by supplying the cooling medium of a predetermined temperature to the cooling jacket 56 from the coolant supply unit 57.

A dielectric window 61 made of quartz glass or the like is provided at the top opening of the processing chamber 50 through a sealing member 60 such as an O-ring for securing an airtight seal. By this dielectric window 61, the processing chamber 50 is closed. Provided on the dielectric window 61 is a RLSA (Radial Line Slot Antenna) serving as a high frequency supply unit for supplying microwaves to generate plasma.

The RLSA 62 includes an antenna main body 63 of a cylindrical shape with its bottom opened. Provided in the opening of the antenna main body 63 is a slot plate 64 of a disk shape having a plurality of slots. A phase delay plate 65 formed of a low loss dielectric material is provided on the slot plate 64 in the antenna main body 63. A coaxial waveguide 67 communicating with a microwave oscillator 66 is connected with the top surface of the antenna main body 63. The microwave oscillator 66 is installed at outside of the processing chamber 50 and can generate microwaves of a specific frequency, e.g., 2.45 GHz, to the RLSA 62. The microwaves generated from the microwave oscillator 66 is compressed to have a shorter wavelength at the phase delay plate 65 after propagating through the RLSA 62. Then, after generating circularly-polarized waves by the slot plate 64, the microwaves are radiated into the processing chamber 50 through the dielectric window 61.

Provided at an upper portion of the processing chamber 50 are gas supply ports 70 for supplying a plasma generation gas. The gas supply ports 70 are formed at plural locations along the inner peripheral surface of the processing chamber 50. Gas supply lines 72 communicating with a gas supply source 71 are connected at the respective gas supply ports 70, the gas supply source 71 being installed at the outside of the processing chamber 50. In this embodiment, an argon gas, a rare gas, is confined in the gas supply source 71.

A source gas supply structure 80 is provided between the mounting table 51 within the processing chamber 50 and the RLSA 62. The supply structure 80 is formed in a disk shape, whose diameter is at least larger than that of the substrate W, and arranged so as to face both the mounting table 51 and the RLSA 62. The inside of the processing chamber 50 is partitioned with the supply structure 80 into a plasma excitation region R1 at the side of the RLSA 62 and a plasma diffusion region R2 at the side of the mounting table 51.

Figure 3:
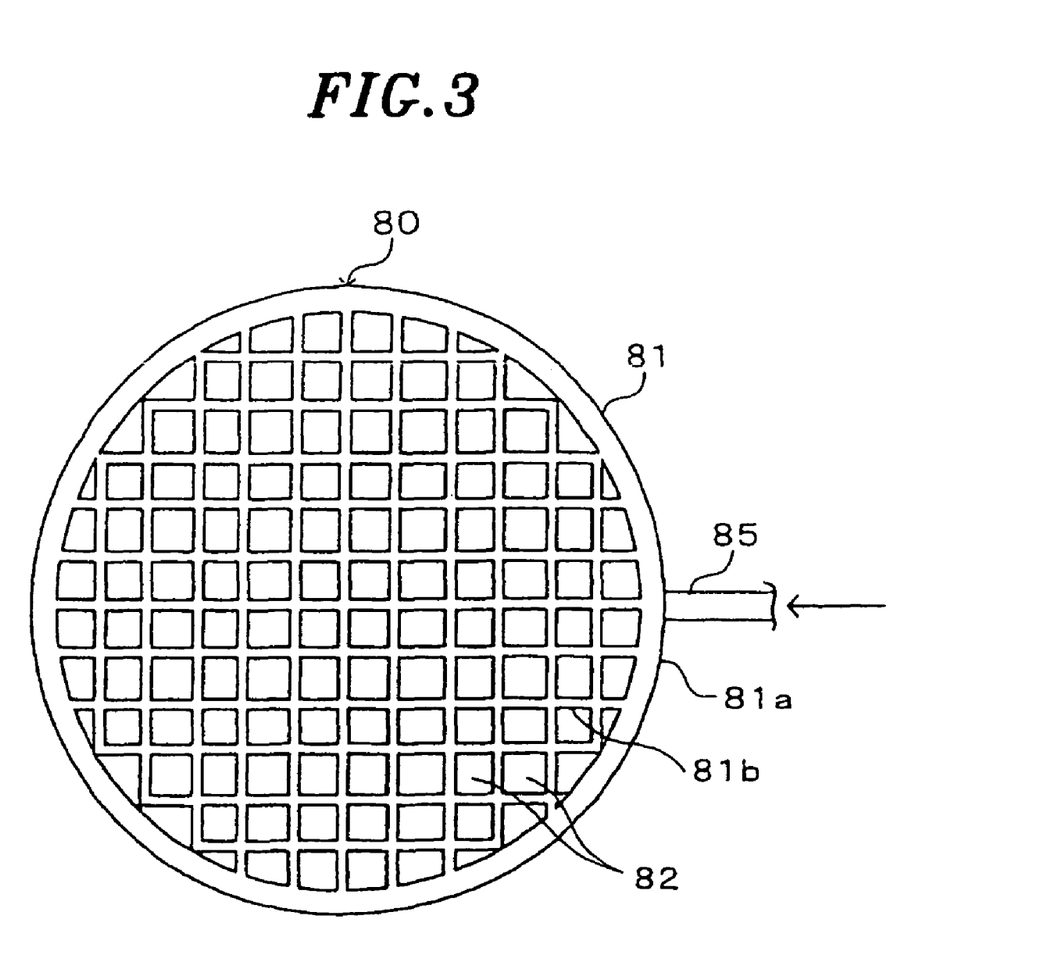
FIG. 3 is a top view of a source gas supply structure in the apparatus shown in FIG. 2.

As shown in FIG. 3, the source gas supply structure 80 has a series of source gas supply lines 81 disposed on the same plane approximately in a grid pattern. The gas supply lines 81 include annular-shaped lines 81a disposed at an outer peripheral portion of the supply structure 80 and grid-patterned lines 81b disposed orthogonally to each other at the inner side of the annular-shaped lines 81a. As shown in FIG. 2, each of the gas supply lines 81 has a rectangular cross sectional shape.

Further, as shown in FIGS. 2 and 3, the source gas supply structure 80 includes a plurality of openings 82 between the source gas supply lines 81. As shown in FIG. 2, plasma generated in the plasma excitation region R1 above the supply structure 80 is introduced into the plasma diffusion region R2 below the supply structure 80 through the openings 82.

A planar dimension of each opening 82 is set to be shorter than the wavelength of the microwaves radiated from the RLSA 62. By doing so, the microwaves radiated from the RLSA 62 are reflected at the source gas supply structure 80, thereby suppressing the microwaves from entering the plasma diffusion region R2. By coating a passivation film on the surface of the supply structure 80, i.e., the surface of the source gas supply lines, it is possible to prevent a sputtering of the supply structure 80 caused by charged particles in the plasma. In this way, the substrate W can be prevented from being contaminated by particles which otherwise would be sputtered.

As shown in FIG. 2, source gas supply ports 83 are formed at the bottom surfaces of the supply lines 81 of the source gas supply structure 80. These source gas supply ports 83 are disposed uniformly in the plane of the supply structure 80. The source gas supply ports 83 may be disposed uniformly only in a region corresponding to the substrate W mounted on the mounting table 51. A gas line 85 communicating with a source gas supply unit 84 disposed at the outside of the processing chamber 50 is connected to the source gas supply line 81. The source gas supply unit 84 contains therein as a source gas, a gaseous mixture of fluorine and carbon, e.g., $C_5F_8$ gas. The source gas supplied to the source gas supply lines 81 through the gas line 85 from the source gas supply unit 84 is injected into the below plasma diffusion region R2 through the source gas supply ports 83.

Provided at the bottom portion of the processing chamber 50 are gas exhaust openings 90 for exhausting the atmosphere in the processing chamber 50. Gas exhaust lines 92 communicating with a gas exhaust unit 91 such as a turbo molecular pump are connected to the respective gas exhaust openings 90. The inside of the processing chamber 50 can be depressurized to a predetermined pressure by evacuating it through the exhaust openings 80.

The configurations of the insulating film forming apparatus 33 is same as those of the insulating film forming apparatus 32, so descriptions thereon will be omitted.

Next, there will be described the configurations of the aforementioned insulating film processing apparatuses 34, 35 by taking the insulating film processing apparatus 34 as an example.

Figure 4:
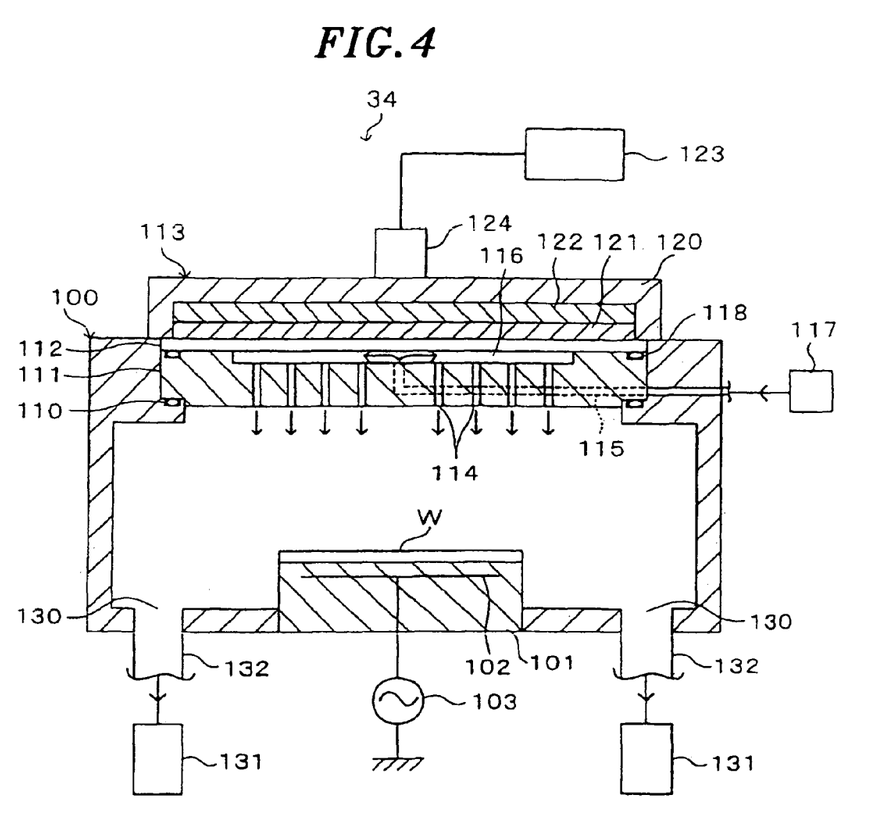
FIG. 4 is a cross sectional view of an insulating film processing apparatus in the system shown in FIG. 1.

FIG. 4 shows schematically a cross sectional view of the insulating film processing apparatus 34. The insulating film processing apparatus 34 is a plasma processing apparatus for processing an insulating film on a substrate W by generating plasma from a rare gas with a high frequency power and then by colliding active species in the plasma against the substrate W.

As shown in FIG. 4, the insulating film processing apparatus 34 is formed of, e.g., an aluminum alloy and includes a processing chamber 100 of a cylindrical shape having a bottom wall with the top opened. A mounting table 101 is provided approximately at the middle wall of the bottom portion of the processing chamber 100. An electrode plate 102 is embedded in the mounting table 101, and is connected to a bias high frequency power supply 103 of, e.g., 13.56 MHz provided at an outside of the processing chamber 100. A negative high voltage is applied to a surface of the mounting table 101 from the high frequency power supply 103, so that positive ions, which are active species in plasma generated within the processing chamber 100, are attracted toward the mounting table 101 to be made to collide at a high speed against the surface of the substrate W on the mounting table 101. Further, the electrode plate 102 is also connected to a DC power source (not shown), which generates an electrostatic force on the surface of the mounting table 101, so that the substrate W can be electrostatically chucked onto the mounting table 101.

A shower plate 111 is attached at the top opening of the processing chamber 100 through a sealing member 110 such as an O-ring for securing an airtight seal. The shower plate 111 is formed of, e.g., a dielectric material such as $Al_2O_3$ or the like. The top opening of the processing chamber 100 is closed by the shower plate 111. A RLSA 113 for supplying a microwave to generate plasma is provided at the upper side of the shower plate 111 with a cover plate 112 interposed therebetween.

The shower plate 111 is formed, e.g., in a disk shape and disposed so as to face the mounting table 101. At the shower plate 111, a plurality of gas supply openings 114 are formed to extend vertically therethrough. A gas supply line 115 is horizontally extended through the shower plate 111 to the middle portion thereof from the side surface of the processing chamber 100, and is opened at the top surface of the shower plate 111. By a recess formed in the top surface of the shower plate 111, a gas channel 116 is formed between the shower plate 111 and the cover plate 112. The gas channel 116 is in communication with the gas supply line 115 and each of the gas supply openings 114. Accordingly, the plasma gas supplied to the gas supply line 115 is delivered to the gas channel 116 through the gas supply line 115 and is supplied into the processing chamber 100 through each of the gas supply openings 114 from the gas channel 116.

The gas supply line 115 is in communication with a gas supply source 117 installed at an outside of the processing chamber 100. Krypton gas, which is a rare gas, is contained in the gas supply source 117. Accordingly, the krypton gas serving as a plasma excitation gas can be supplied into the processing chamber 100.

The cover plate 112 is attached to the top surface of the shower plate 111 through a sealing member 118 such as an O-ring. The cover plate 112 is formed of, e.g., a dielectric material such as $Al_2O_3$ or the like.

The RLSA 113 includes an antenna main body 120 of approximately cylindrical shape with its bottom opened. In the opened portion of the antenna main body 120, a slot plate 121 is provided, and a phase delay plate 122 is provided on the slot plate 121. A coaxial waveguide 124 communicating with a microwave oscillator 123 is connected at the antenna main body 120. The microwave oscillator 123 is installed at the outside of the processing chamber 100 and generates microwaves of a specific frequency, e.g., 2.45 GHz, to the RLSA 113. The microwaves generated from the microwave oscillator 123 are compressed to have a shorter wavelength at the phase delay plate 122 after propagating through the RLSA 113. Then, after generating circularly-polarized waves by the slot plate 121, the microwaves are radiated into the processing chamber 100 through the cover plate 112 and the shower plate 111.

Provided at the bottom portion of the processing chamber 100 are gas exhaust openings 130 for exhausting the atmosphere in the processing chamber 100. Gas exhaust lines 132 communicating with a gas exhaust unit 131 such as a turbo molecular pump are connected to the respective gas exhaust openings 130. The inside of the processing chamber 100 can be depressurized to a predetermined pressure by evacuating it through the gas exhaust openings 90. From this depressurization, water molecules present in the processing chamber 100 can be removed, thereby keeping the inside of the processing chamber 100 in an atmosphere free of water moisture.

As discussed above, the insulating film processing apparatus 34 is configured such that, unlike the insulating film forming apparatus 32 shown in FIG. 2, no source gas supply structure is disposed between the RLSA 113 and the mounting table 101. Further, since the insulating film processing apparatus 35 has the same configurations as the insulating film processing apparatus 34, descriptions therefor will be omitted.

Next, there will be described a method for processing the substrate W using the substrate processing system 1 constructed as set forth above by taking as an example a case of processing a substrate for a semiconductor device of a multi-layered structure, which is an electric device.

For example, a substrate W, having a conductive film formed thereon as a wiring layer in a different process apparatus, is accommodated in the cassette C, and the respective cassette C is mounted on the cassette table 4 of the substrate processing system 1, as shown in FIG. 1. At this time, the atmosphere in the transfer path 8 of the substrate processing system 1 is replaced with a dry gas supplied from the gas supply line 21, for example, and then depressurized to a predetermined pressure by a gas exhaust through the gas exhaust line 23. By doing so, the inside of the transfer path 8 is maintained in a depressurized atmosphere with no moisture.

Once the cassette C is mounted on the cassette table 4, the substrate W is unloaded from the cassette C by the substrate transfer unit 6 and transferred to the pre-alignment stage 7. The substrate W that has undergone position alignment at the stage 7 is transferred to, for example, the load-lock chamber 30 through the gate valve 37 by the substrate transfer unit 6. The substrate W in the load-lock chamber 30 is transferred to the insulating film forming apparatus 32 through the transfer path 8 by the substrate transfer device 39.

The substrate W transferred to the insulating film forming apparatus 32 is, as shown in FIG. 2, electrostatically chucked on the mounting table 51 within the processing chamber 50. At this time, the substrate W is maintained at a temperature of, e.g., 350° C. by heat from the heater 54. Subsequently, the processing chamber 50 is exhausted by the gas exhaust unit 91 to be depressurized to a predetermined pressure, e.g., approximately 13.3 Pa (100 mTorr). With such depressurization, the inside of the processing chamber 50 is also maintained in a moisture-free atmosphere.

Once the inside of the processing chamber 50 is depressurized, argon gas is supplied into the plasma excitation region R1 through the gas supply port 70. From the RLSA 62, microwaves of, e.g., 2.45 GHz are radiated toward the plasma excitation region R1 located just below the RLSA 62. With such microwave radiation, the argon gas is converted into plasma in the plasma excitation region R1. At this time, the microwaves radiated from the RLSA 62 are reflected at the source gas supply structure 80 and remained in the plasma excitation region R1. As a result, a so-called high density plasma space is formed within the plasma excitation region R1.

Meanwhile, a negative voltage is applied by the bias high frequency power supply 53 to the mounting table 51. Therefore, the plasma generated within the plasma excitation region R1 is diffused into the plasma diffusion region R2 through the openings 82 of the source gas supply structure 80. $C_5F_8$ gas is supplied to the plasma diffusion region R2 through the source gas supply ports 83 of the source gas supply structure 80. The $C_5F_8$ gas is activated by, e.g., the plasma diffused from the plasma excitation region R1, and with the active species of the $C_5F_8$ gas, a CF insulating film made up of fluorine and carbon atoms is formed on the substrate W. At this time, the fluorine (F) atoms are exposed by being arranged at the surface of the CF insulating film I as shown in FIG. 10.

Since the gas used in forming the CF insulating film does not include H atoms, it is prevented that the F atoms in the film are combined with H atoms to generate HF. Therefore, the CF insulating film has an exceptionally high quality.

After the CF insulating film I of a predetermined thickness is formed on the substrate W, the microwave radiation and the supply of the source gas and the plasma gas are stopped and the substrate W on the mounting table 51 is unloaded from the processing chamber 50 by the substrate transfer device 39. The substrate W unloaded from the insulating film forming apparatus 32 is transferred to the insulating film processing apparatus 34 through the transfer path 8. In the meantime, since the inside of the transfer path 8 is maintained in a dry atmosphere, there is no case where moisture comes in contact with the surface of the CF insulating film I on the substrate W.

Figure 5:
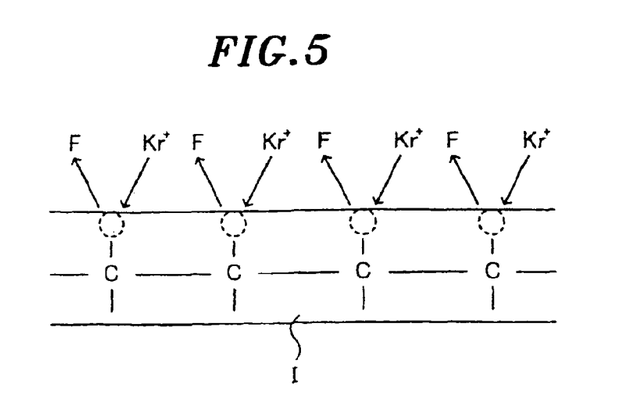
FIG. 5 is an exemplary diagram showing a state where fluorine atoms are released from the surface of a CF insulating film.

The insulating film processing apparatus 34 is maintained in advance in a depressurized atmosphere of, e.g., 33.3 Pa (250 mTorr) by the gas exhaust through the gas exhaust openings 130. Accordingly, even when the substrate W is loaded therein, the substrate W is kept under a dry atmosphere. The substrate W transferred to the insulating film processing apparatus 34 is electrostatically chucked on the mounting table 101 while temperature is adjusted to, e.g., 30° C. While the substrate W is held on the mounting table 101, a negative high voltage is applied to the mounting table 101 by the bias high frequency power 103. Meanwhile, krypton gas is supplied downwardly at, e.g., 50 cm³/min from the shower plate 111 and microwaves of 2.45 GHz are radiated at a power of, e.g., 500 W from the RLSA 113. With such microwave radiation, the krypton gas is converted into plasma and krypton ions $Kr^+$, which are active species in the plasma, are attracted by a negative potential of the mounting table 101. From this, the krypton ions $Kr^+$ are made to collide at a high speed with the surface of the substrate W on the mounting table 101. As shown in FIG. 5, due to the collisions of the $Kr^+$, the fluorine (F) atoms exposed at the surface of the insulating film I on the substrate are separated or released from the insulating film I.

For example, after the microwaves are irradiated for 5 seconds and the sufficient fluorine atoms at the surface of the CF insulating film I on the substrate W are separated therefrom, the irradiation of the microwaves and the supply of the krypton gas are stopped. Then, the substrate W is unloaded from the insulating film processing apparatus 34 by the substrate transfer device 39. The unloaded substrate W is transferred to the load-lock chamber 31 through the transfer path 8 and accommodated within the cassette C on the cassette table 4 by the substrate transfer unit 6. Next, in a different processing apparatus, after the CF insulating film I on the substrate W is patterned by using a photolithographic method, conductive film and/or a protective film is formed in a predetermined pattern, thereby manufacturing a semiconductor device.

In accordance with the aforementioned embodiments, after forming the CF insulating film I on the substrate W, the active species are made to collide to the surface of the CF insulating film I at a high speed while preventing the CF insulating film I from contacting with moisture, so that the fluorine atoms are separated or reflected from the surface of the CF insulating film I. As a result, the fluorine atoms exposed at the surface of the CF insulating film I are removed therefrom, so there is no case where the fluorine atoms react with water molecules. Accordingly, hydrogen fluoride gas is prevented from being released from the CF insulating film I, and, for example, films in other layers within the semiconductor device are prevented from bring damaged or peeled-off. Further, degrading of the surface of the CF insulating film I and increase in relative dielectric constant of the CF insulating film I are also avoided. Also, in the aforementioned embodiments, although the krypton gas is used as a gas for forming plasma in the insulating film processing apparatus 34, another rare gas such as helium, xenon, or argon gas, or nitrogen gas may be used.

In the above-described embodiments, by positively actively colliding the active species, generated in plasma of a rare gas or nitrogen gas, against the CF insulating film I, the fluorine atoms at the surface of the CF insulating film I are made to separate or release therefrom. Alternatively, the fluorine atoms may be released by exposing the substrate W having the CF insulating film I to the plasma formed from the rare gas or the nitrogen gas.

In this case, for example, krypton gas, a rare gas, is supplied from the shower plate 111 in the insulating film processing apparatus 34 of FIG. 4. Further, with the microwaves supplied from the RLSA 113, the krypton gas is converted into plasma and a high density plasma space having, for example, an electron temperature of less than 2 eV and an electron density of higher than $1 \times 10^{11}$ electrons/cm$^3$ is formed within the processing chamber 100. By exposing the substrate W to the high density plasma space, the fluorine atoms exposed at the surface of the CF insulating film I on the substrate W are separated or released therefrom due to, for example, energy created by the krypton ions and/or a photon energy which gets released when the krypton ions are converted back to the krypton gas. In this case, since the krypton gas having high excitation energy is employed, the release of the fluorine atoms can be efficiently carried out in a short period of time. Further, in this embodiment, a rare gas other than the krypton gas such as xenon gas, or argon gas or nitrogen gas may be used as a gas for generating plasma.

Instead of the release method of the fluorine atoms mentioned in the above embodiment, the fluorine atoms may be released by irradiating electron beams to the substrate W having the CF insulating film I formed thereon.

Figure 6:
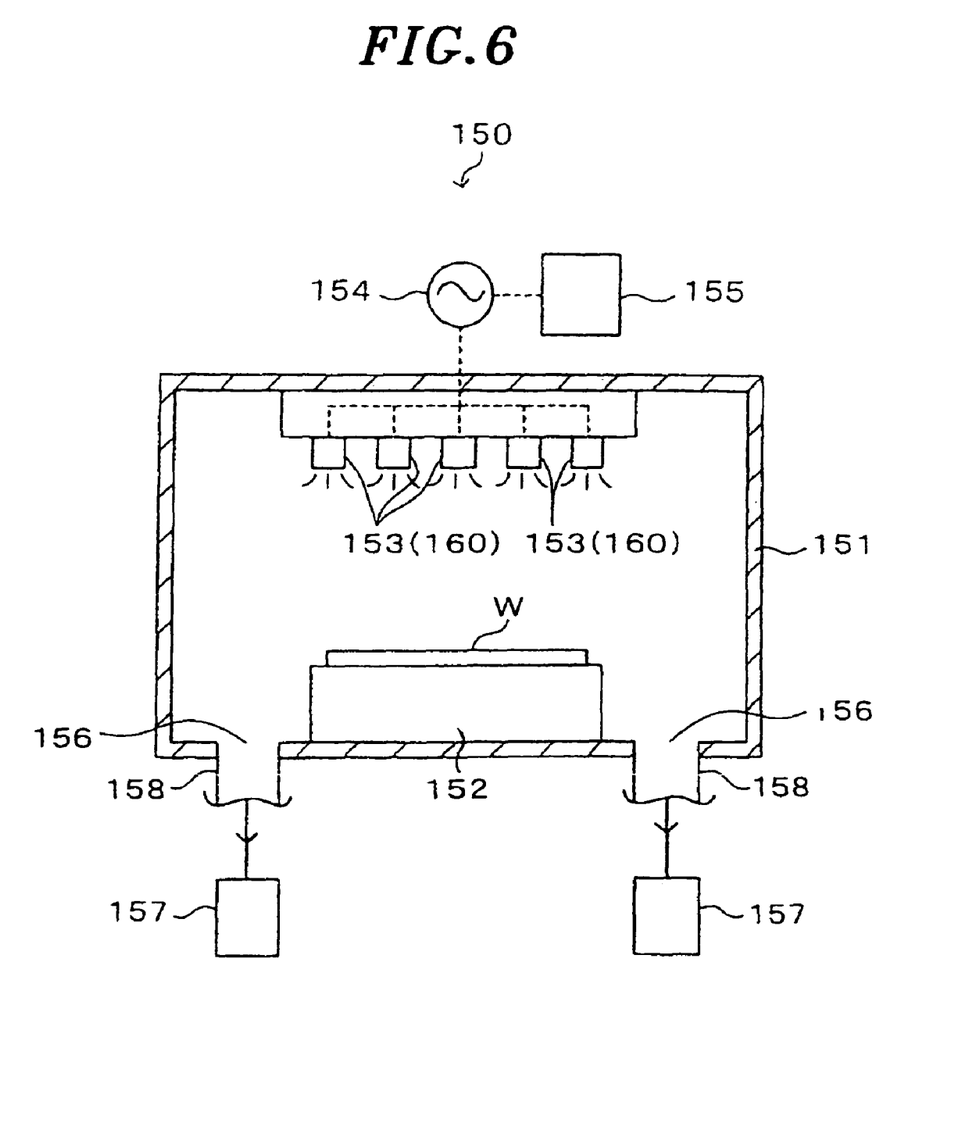
FIG. 6 is a cross sectional view of an insulating film forming process apparatus having electronic beam irradiators.

In this case, an insulating film processing apparatus 150 shown in FIG. 6 is employed instead of the insulating film processing apparatus 34 of FIG. 4, for example. This insulating film processing apparatus 150 includes a closable processing chamber 151. A mounting table 152 is disposed at a bottom middle portion of the processing chamber 151. At the upper portion of the processing chamber 151, a plurality of electron beam radiators 153 are provided to face the mounting table 152. These electron beam radiators 153 are arranged to uniformly irradiate electron beams to the surface of a substrate W mounted on the mounting table 152. The electron beam radiators 153 are configured to irradiate the electron beams by applying a high voltage thereto with a high voltage power supply 154 installed at outside of the processing chamber 151. Further, the amount of irradiation of the electron beams can be controlled by, for example, a controller 155 which controls the operation of the high voltage power supply 154.

Provided at the bottom portion of the processing chamber 151 are gas exhaust openings 156 for exhausting the atmosphere in the processing chamber 151. Gas exhaust lines 158 communicating with a gas exhaust unit 157 such as a turbo molecular pump are connected at the respective gas exhaust openings 156. By the gas exhaust through the exhaust openings 156, the inside of the processing chamber 151 can be depressurized to a predetermined pressure, thereby maintaining the inside of the processing chamber 151 in a depressurized atmosphere with no moisture.

Further, upon release of the fluorine atoms, the inside of the processing chamber 151 is maintained in a dry atmosphere in advance by the gas exhaust through the gas exhaust openings 156, and then the substrate W is loaded into the processing chamber 151. The loaded substrate W is mounted onto the mounting table 152, and the electron beams are then irradiated to the CF insulating film I on the substrate W from the electron beam radiators 153. Due to the energy of the electron beams, the fluorine atoms exposed at the surface of the CF insulating film I are separated from the carbon atoms and get released. In this case, by the irradiation of the electron beams of the high energy, the fluorine atoms can be efficiently released. Further, since the electron beams are penetrated even to the inside of the CF insulating film I, fluorine atoms existing in an unstable state due to an incomplete bonding thereof are released, thereby increasing the quality of the CF insulating film I itself.

In this embodiment, although the electron beams are irradiated to the surface of the CF insulating film I, ultraviolet rays may be radiated instead. In this case, ultraviolet irradiators 160 are provided at the insulating film processing apparatus 150 instead of the electron beam irradiators 153. In a case where the ultraviolet rays are irradiated to the CF insulating film I, the release of the fluorine atoms are efficiently performed by the ultraviolet rays of high energy. Also, the fluorine atoms existing in an unstable state within the CF insulating film I can be released as well.

In the aforementioned embodiments, by releasing the fluorine atoms exposed at the surface of the CF insulating film I, reaction of the fluorine atoms with water molecules is prevented. Alternatively, by forming a protective film for preventing water molecules from contacting with the CF insulating film formed on the substrate W, the reaction of the fluorine atoms with water molecules can also be prevented.

Figure 7:
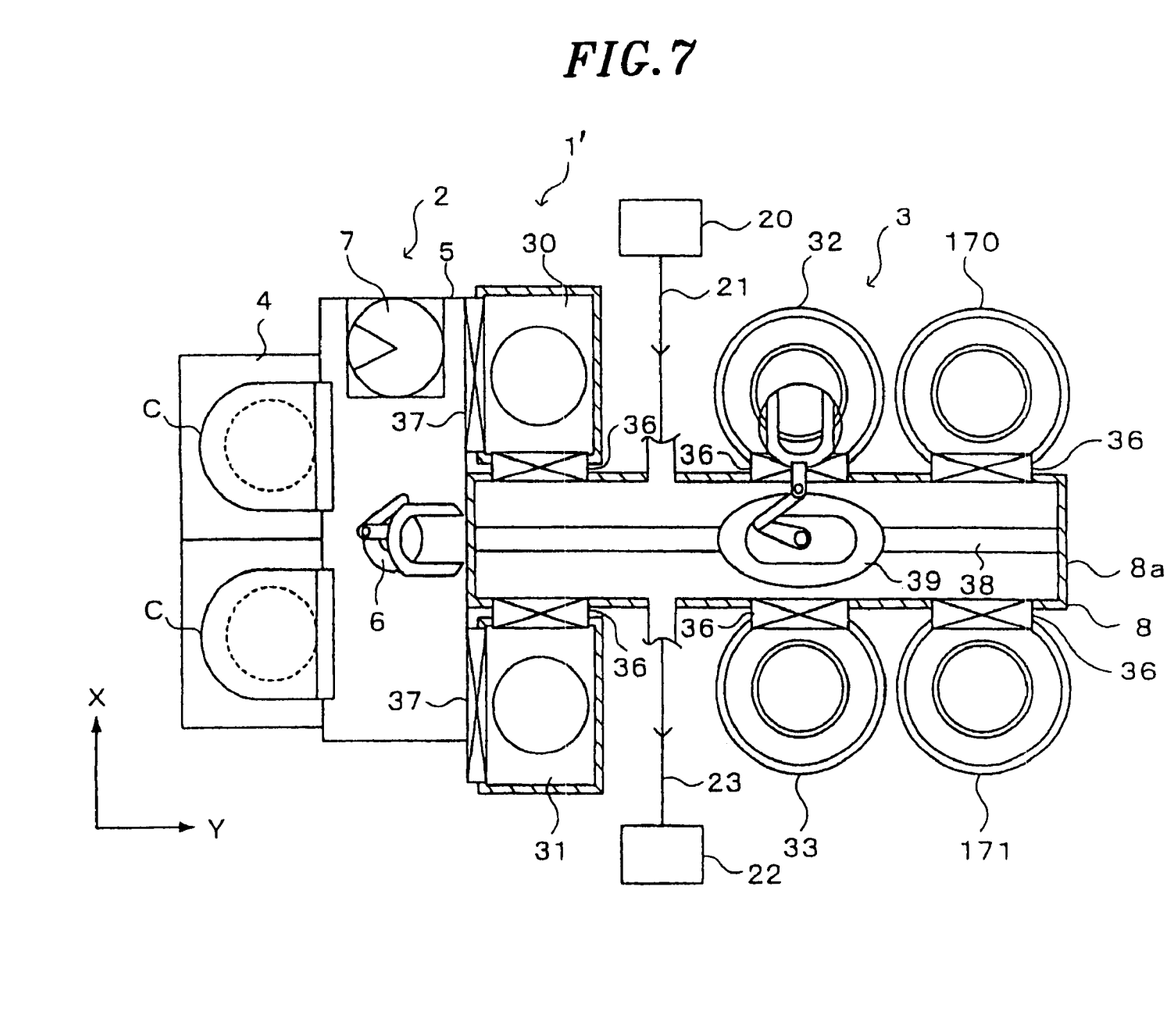
FIG. 7 is a schematic view of another substrate processing system used in the processing method of the substrate for electronic device in accordance with the present invention.

In this case, as shown in FIG. 7, there will be used a substrate processing system 1' having insulating film processing apparatuses 170, 171 for forming the protective film instead of the insulating film processing apparatuses 34, 35 of the processing system 1. As for the insulating film processing apparatuses 170, 171, a plasma CVD apparatus which uses plasma to form films is employed.

Figure 8:
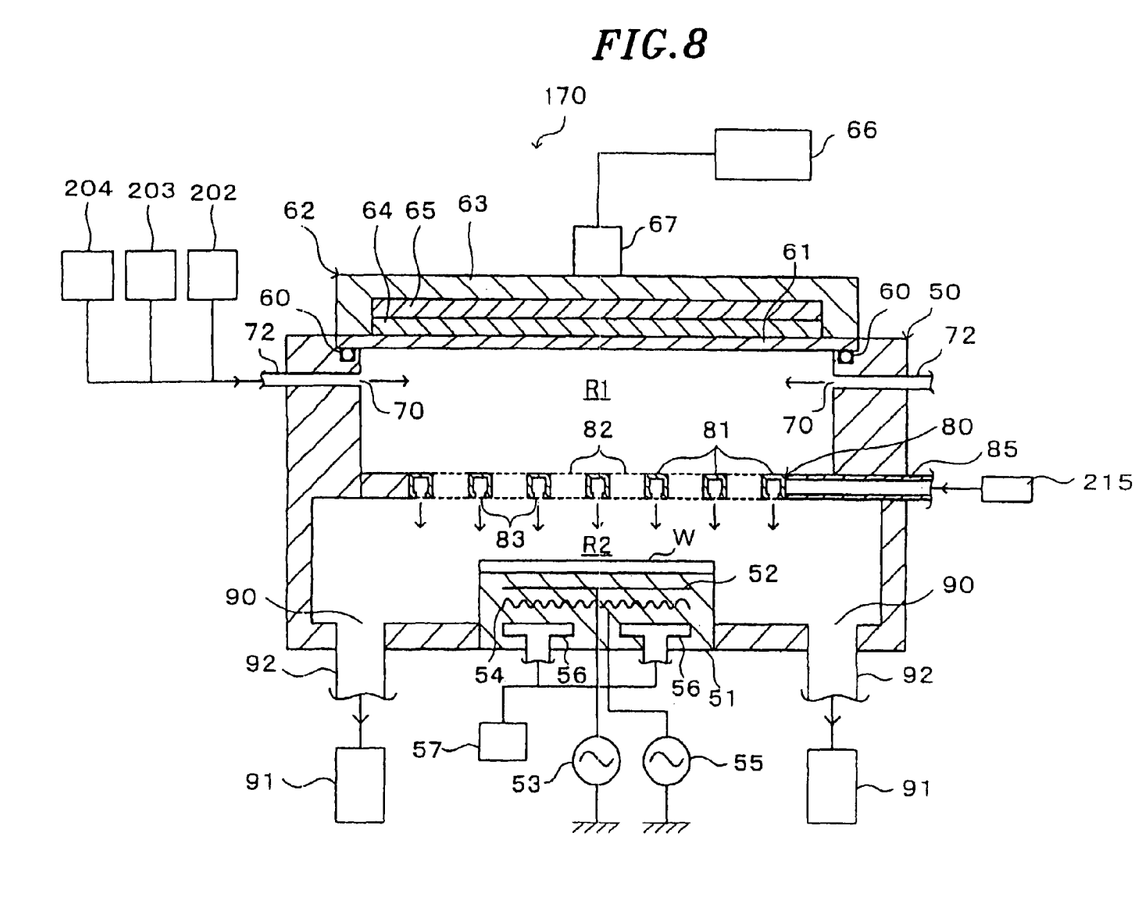
FIG. 8 is a cross sectional view of an insulating film processing apparatus in the system shown in FIG. 7.

As shown in FIG. 8, the insulating film processing apparatus 170 includes a first, a second, and a third gas supply source 202, 203, 204 and a source gas supply unit 215 in place of the gas supply sources 71 and the source gas supply unit 84 shown in FIG. 2, respectively. The other configurations of the insulating film processing apparatus 170 are substantially the same as those of the insulating film processing apparatus 32 shown in FIG. 2.

In this embodiment, in order to form a protective film made up of SiN on the substrate W, for example, hydrogen gas, argon gas, and nitrogen gas are contained in the first gas supply source 202, the second gas supply source 203, and the third gas supply source 204, respectively. Further, silane gas is provided as a source gas within the source gas supply unit 215.

Moreover, since the configurations of the insulating film processing apparatus 171 are identical to those of the insulating film processing apparatus 170, descriptions therefor will be omitted.

In the substrate processing system 1' constructed as described above, the CF insulating film I is first formed on the surface of the substrate W by using the insulating film forming apparatus 32 or 33, as in the aforementioned embodiment. Then, the substrate W is transferred into the insulating film processing apparatus 170 or 171, e.g., the processing apparatus 170 through the transfer path 8 while preventing the substrate from contacting with moisture. The inside of the processing apparatus 170 is depressurized in advance by the gas exhaust through the gas exhaust openings 90 and maintained in a dry atmosphere. The substrate W transferred into the insulating film processing apparatus 170 is mounted on the mounting table 51.

The substrate W is maintained at a temperature of, e.g., about 350° C. by the heater 54 within the mounting table 51.

A gaseous mixture of argon, hydrogen and nitrogen gases is supplied into the plasma excitation region R1 through the gas supply ports 70. The RLSA 62 radiates microwaves of 2.45 GHz to the plasma excitation region R1 located therebelow, so that the gaseous mixture in the plasma excitation region is converted into plasma.

Figure 9:
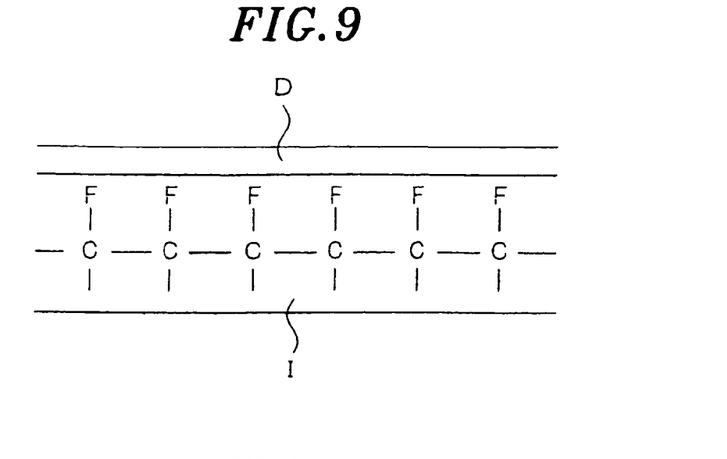
FIG. 9 is an exemplary diagram showing a state where a protective film is formed on a CF insulating film.

A negative voltage is applied to the mounting table 51 by the bias high frequency power supply 53, and the plasma within the plasma excitation region R1 is diffused into the plasma diffusion region R2 through the source gas supply structure 80. Silane gas is supplied in the plasma diffusion region R2 through the source gas supply ports 83, and the silane gas is activated by the plasma diffused from the plasma excitation region R1. With radicals of the silane gas and/or the nitrogen gas, SiN deposits and grows on the surface of the CF insulating film I of the substrate W. Accordingly, as shown in FIG. 9, a protective film D made up of a SiN film (silicon nitride film) having a thickness of less than 200 Å and preferably less than 100 Å, e.g., about 30 to 90 Å is formed on the CF insulating film I.

According to this embodiment, the substrate W can be transferred to the insulating film processing apparatus 170 while keeping the substrate W out of contact with water molecules, and the protective film D made up of SiN can be formed on the CF insulating film I in the processing apparatus 170. From this, the reaction of the fluorine atoms exposed at the surface of the CF insulating film I with water molecules can be prevented. As a result of this, since hydrogen fluoride gas is prevented from being released from the CF insulating film I, other films within the semiconductor device are prevented from being damaged and peeled off by the hydrogen fluoride gas. Further, the CF insulating film I itself is prevented from changing in quality, which can be caused by reacting with water molecules, and increase in a dielectric constant thereof is prevented. Also, since the protective film D made up of SiN is formed on the CF insulating film I to have a thickness of less than 200 Å, the insulation quality of the whole films including the CF insulating film I and the protective film D can be maintained.

The materials for the protective film D is not limited to the SiN, and another material such as amorphous carbon, SiCN, SiC, SiCO or CN, which has a low dielectric constant, may be used. The amorphous carbon includes an amorphous carbon containing hydrogen atoms in the film. In case of using the material of amorphous carbon, SiCN, SiC, SiCO or CN, the protective film D can be made thicker because it has a lower dielectric constant than SiN. Forming of the protective film D can be therefore carried out in a simpler manner. For example, when the material of the protective film D is amorphous carbon, SiCN, SiC, SiCO or CN, it preferably has a thickness of 5 to 500 Å. Further, the insulating film processing apparatus for forming the protective film D may be another film forming apparatus such as the plasma CVD apparatus using an electron cyclotron resonance, a sputtering apparatus, an ICP plasma apparatus, or a CCP plasma apparatus.

Also, the carbon atoms at the surface of the CF insulating film I on the substrate W may be nitrified after releasing the fluorine atoms from the CF insulating film I as in the aforementioned embodiments (FIGS. 1 to 6). In this case, the surface of the CF insulating film serves as a protective film.

Further, the protective film D of the substrate W may be formed on the CF insulating film I after releasing the fluorine atoms from the CF insulating film I as in the aforementioned embodiments (FIGS. 1 to 6). In this way, the reaction of the fluorine atoms at the surface of the CF insulating film I with water molecules can be prevented more certainly.

Figure 11A:
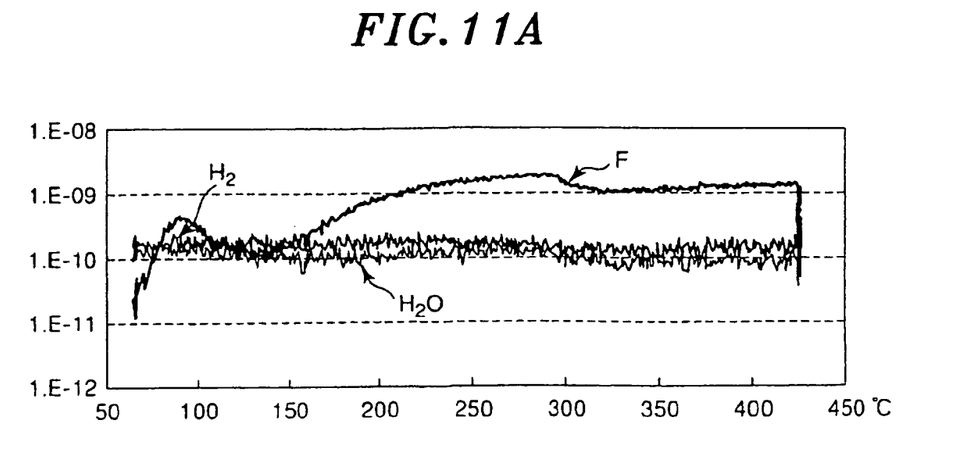
FIG. 11A is a graph showing a TDS measurement result for a substrate of a comparative example where no processing is conducted on the substrate after the CF insulating film is formed thereon.
Figure 11B:
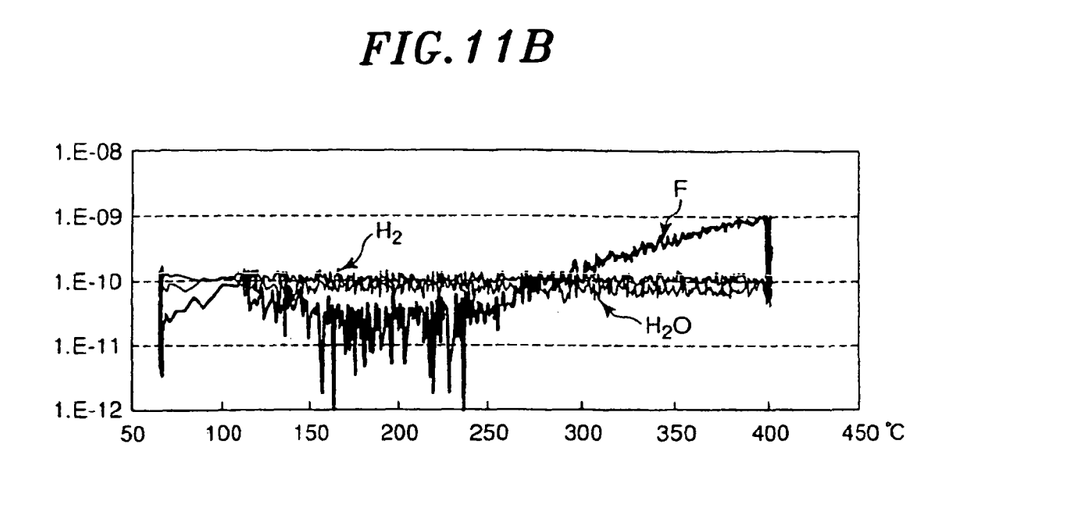
FIG. 11B is a graph showing a TDS measurement result for a substrate of an example where the substrate is exposed to Ar plasma for 5 seconds after the CF insulating film is formed thereon.
Figure 11C:
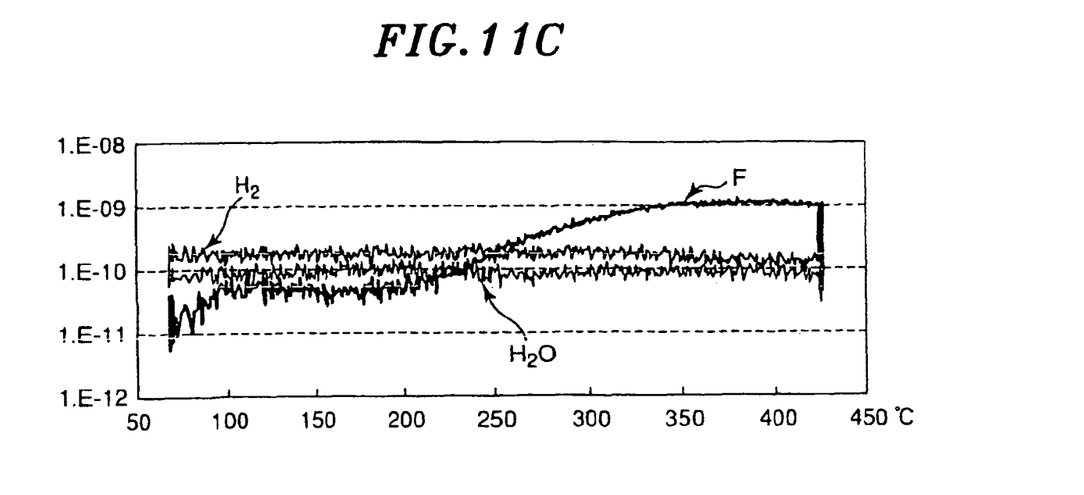
FIG. 11C is a graph showing a TDS measurement result for a substrate of an example where the substrate is exposed to $N_2$ plasma for 5 seconds after the CF insulating film is formed.

FIGS. 11A to 11C show results of a test for confirming quality and condition of a CF insulating film processed in accordance with the previous embodiments (FIGS. 1 to 5). FIG. 11A illustrates a comparative example showing a TDS (thermal desorption spectroscopy) measurement result of a case where no processing is conducted after the CF insulating film is formed on a substrate; FIG. 11B illustrates an example showing a TDS measurement result of a case where a substrate is exposed to Ar plasma for 5 seconds after the CF insulating film is formed thereon; and FIG. 11C illustrates an example showing a TDS measurement result of a case where a substrate is exposed to $N_2$ plasma for 5 seconds after the CF insulating film is formed thereon.

As can be seen from FIGS. 11A to 11C, by exposing the CF insulating film to the plasma, degassing amount (especially, F) from the film is reduced. Although FIGS. 11A to 11C show representative degas elements, reduction of other elements such as C, CF, $CF_2$, and $SiF_3$ have been also observed actually due to the exposure to the plasma. This means that, when the substrate is subjected to an anneal processing after the CF insulating film is formed thereon, the degassing amount from the CF insulating film is small. Accordingly, occurrences of voids are prevented between the CF insulating film and a barrier layer, a wiring layer, a protective layer or the like, which is laminated thereon, and a good adhesivity is maintained therebetween.

Further, although some embodiments of the present invention have been discussed above, the present invention is not limited thereto and may be variously modified. For example, although the substrate W having the CF insulating film I thereon is used in the semiconductor device in the aforementioned embodiments, it may be used in other electronics, for example, a liquid crystal display and an organic EL device.

INDUSTRIAL APPLICABILITY

The present invention is useful in forming an insulating film of a good quality made up of fluorine and carbon at a surface of a substrate for electronic device in a field of manufacturing the electronic devices such as the semiconductor device, the liquid crystal display and the organic EL device.

What is claimed is:

1. A method of processing a substrate for an electronic device, the method comprising the steps of:
    preparing a substrate for the electronic device;
    forming an insulating film made up of fluorine and carbon onto a surface of the substrate and forming a protective film on the insulating film to prevent water molecules from contacting with the surface of the insulating film; and
    releasing fluorine atoms exposed at the surface of the insulating film therefrom;
    wherein the substrate is kept out of contact with water molecules, at least, from immediately after the insulating film forming step until completion of the fluorine atom releasing step, and
    wherein the fluorine atom releasing step is performed by making activate species generated in plasma of a rare gas or nitrogen gas collide against the surface of the insulating film.

2. The method of claim 1, wherein the material of the protective film is selected from a group consisting of amorphous carbon, SiN, SiCN, SiC, SiCO and CN.

3. The method of claim 1, wherein the protective film has a thickness of less than 200 Å.

4. The method of claim 1, wherein the rare gas is selected from the group consisting of argon gas, xenon gas and krypton gas.

5. The method of claim 1, wherein the fluorine atom releasing step is performed within a plasma space having an electron temperature of less than 2 eV and an electron density of higher than $1\times10^{11}$ electrons/cm$^3$.

6. The method of claim 1, further comprising:
nitrifying the surface of the insulting film.

7. A method of processing a substrate for an electronic device, the method comprising the steps of:
preparing a substrate for the electronic device;
forming an insulating film made up of fluorine and carbon onto a surface of the substrate and forming a protective film on the insulating film to prevent water molecules from contacting with the surface of the insulating film; and
releasing fluorine atoms exposed at the surface of the insulating film therefrom;
wherein the substrate is kept out of contact with water molecules, at least, from immediately after the insulating film forming step until completion of the fluorine atom releasing step, and
wherein the fluorine atom releasing step is performed by exposing the substrate to plasma generated from a rare gas or nitrogen gas.

8. The method of claim 7, wherein the rare gas is selected from the group consisting of argon gas, xenon gas and krypton gas.

9. The method of claim 7, wherein the fluorine atom releasing step is performed within a plasma space having an electron temperature of less than 2 eV and an electron density of higher than $1\times10^{11}$ electrons/cm$^3$.

10. The method of claim 7, wherein the material of the protective film is selected from a group consisting of amorphous carbon, SiN, SiCN, SiC, SiCO and CN.

11. The method of claim 7, wherein the protective film has a thickness of less than 200 Å.

12. The method of claim 7, further comprising:
nitrifying the surface of the insulting film.

13. A method of processing a substrate for an electronic device, the method comprising the steps of:
preparing a substrate for the electronic device;
forming an insulating film made up of fluorine and carbon onto a surface of the substrate; and
releasing fluorine atoms exposed at the surface of the insulating film therefrom;
wherein the substrate is kept out of contact with water molecules, at least, from immediately after the insulating film forming step until completion of the fluorine atom releasing step, and
wherein the fluorine atom releasing step is performed by irradiating electron beams to the surface of the insulating film.

14. The method of claim 13, further comprising:
forming a protective film on the insulating film to prevent water molecules from contacting with the surface of the insulating film.

15. The method of claim 14, wherein the material of the protective film is selected from a group consisting of amorphous carbon, SiN, SiCN, SiC, SiCO and CN.

16. The method of claim 14, wherein the protective film has a thickness of less than 200 Å.

17. The method of claim 13, further comprising:
nitrifying the surface of the insulting film.

18. A method of processing a substrate for an electronic device, the method comprising the steps of:
preparing a substrate for the electronic device;
forming an insulating film made up of fluorine and carbon onto a surface of the substrate; and
releasing fluorine atoms exposed at the surface of the insulating film therefrom;
wherein the substrate is kept out of contact with water molecules, at least, from immediately after the insulating film forming step until completion of the fluorine atom releasing step, and
wherein the fluorine atom releasing step is performed by irradiating ultraviolet rays to the surface of the insulating film.

19. The method of claim 18, further comprising:
forming a protective film on the insulating film to prevent water molecules from contacting with the surface of the insulating film.

20. The method of claim 19, wherein the material of the protective film is selected from a group consisting of amorphous carbon, SiN, SiCN, SiC, SiCO and CN.

21. The method of claim 19, wherein the protective film has a thickness of less than 200 Å.

22. The method of claim 18, further comprising:
nitrifying the surface of the insulting film.

* * * * *